(12) United States Patent
Peng

(10) Patent No.: US 7,636,268 B1
(45) Date of Patent: Dec. 22, 2009

(54) INTEGRATED CIRCUIT WITH IMPROVED STATIC NOISE MARGIN

(75) Inventor: Tao Peng, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 81 days.

(21) Appl. No.: 12/027,172

(22) Filed: Feb. 6, 2008

(51) Int. Cl.
*G11C 7/02* (2006.01)
(52) U.S. Cl. ..................... 365/206; 365/154
(58) Field of Classification Search ........... 365/154, 365/206
See application file for complete search history.

(56) References Cited

U.S. PATENT DOCUMENTS 7,099,182 B2   8/2006   Ohtake et al.

2007/0030741 A1 *   2/2007   Nii et al. ............. 365/189.11
2008/0043561 A1 *   2/2008   Wang et al. ............ 365/227

OTHER PUBLICATIONS

Ohbayashi et al., "A 65-nm SoC Embedded 6T-SRAM Designed for Manufacturability With Read and Write Operation Stabilizing Circuits," IEEE Journal of Solid-State Circuits, Apr. 2007, pp. 820-829, vol. 42, No. 4.

* cited by examiner

*Primary Examiner*—Hoai V Ho
(74) *Attorney, Agent, or Firm*—Scott Hewett; Lois D. Cartier

(57) ABSTRACT

A static random access memory ("SRAM") has a plurality of SRAM cells connected to a word line. A static noise margin ("SNM") detector controls a pull-down transistor that selectively couples the word line to a ground path. The SNM detector is configured to produce a first output signal in response to a SNM event that couples the word line to the ground path, and otherwise produces a second output signal that de-couples the word line from the ground path.

19 Claims, 4 Drawing Sheets

INTEGRATED CIRCUIT WITH IMPROVED STATIC NOISE MARGIN

FIELD OF THE INVENTION

This invention relates generally to static random access memory ("SRAM"), and more specifically to operating an SRAM array to avoid errors caused by static noise margin ("SNM").

BACKGROUND OF THE INVENTION

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

CMOS technology has been shrinking, that is, the devices and the separation between devices has been getting smaller. The type of spacing used to produce a CMOS IC is commonly called a "technology", such as 180-nano-meter ("nm") technology, and generally represents the minimum spacing between nodes on the physical device. IC technologies of 90 nm and less are generally referred to as "deep submicron" technologies.

SRAM is often used in ICs because it offers speed advantages over DRAM arrays. SRAM cells generally can use the smallest transistor size in each technology generation. SRAM is a more expensive alternative than DRAM, but is desirable where speed is a principal consideration. SRAM is also easier to interface to and allows less constrained (i.e., truly random) access, compared to modern types of DRAM.

An exemplary SRAM cell has two half cells, each half cell having an NMOS device with a gate connected to the gate of a PMOS cell. An access device (e.g., another NMOS device) in the half cell is gated by the word line ("WL") and couples the data state of the half cell to a bit line ("N Bit or N bar Bit") of the memory array. As SRAM cell design shrinks into the submicron and deep submicron range, variations in cell performance arise from minor differences in the fabrication processes. One effect of typical process variation is that the NMOS devices in a cell might operate faster or slower than the PMOS devices, or the transistors in the two half cells do not match with each other. The operating speed ratio can vary across an SRAM array due to runout and similar effects. A "fast" device has a lower threshold voltage ("$V_{TH}$") and generally transfers more charge (or produces more current) during a READ or WRITE operation than a slower device.

SRAM cell design is constrained by a worst-case corner for a READ disturbance when the NMOS devices are fast, and the PMOS devices are slow, called a Fast-Slow ("FS") corner, and a worst-case corner for a WRITE difficulty when the NMOS devices are slow, and the PMOS devices are fast, called a SF corner.

One approach to satisfying both FS and SF operation of SRAM cells in a memory array is to increase the physical size of the memory cells. However, this is contrary to the desired advantages (e.g., higher cell density per silicon area) by using the smaller node technology. Data on 45-nm technology indicates that SRAM cell size might have to increase as much as 20% from the scaled cell size according to the design route checker ("DRC") limitation.

FIG. 1 is a circuit diagram of a portion of an SRAM memory 100 illustrating another approach that has been proposed to improve SRAM operation. The SRAM memory 100 includes statically ON NMOS devices 102, 104, 106, 108 that couple wordlines 110, 112 of the SRAM memory array to ground during a READ operation. The NMOS devices 102, 104, 106, 108 are referred to as "replica access transistors" in a read assist circuit 114. The NMOS devices in the read assist circuit 114 lower the word line level when that word line is activated by the word line driver 116 during a READ operation. The NMOS devices in the read assist circuit 114 basically operate in parallel with the NMOS devices in memory cell 124 to bring the word line 112 to ground, which in turn weakly turns on the NMOS pass gate transistors 120, 122 in the memory cell 124, thus improving the SNM by increasing the effective resistance of pass gates 120 and 122 to the bit lines 126, 128. The word line voltage is lowered for improved SNM using the always ON replica transistors to provide tracking capability. Unfortunately, this approach degrades overall cell performance, as measured by the lowered READ current through the passgate, and increased static current on the active word line.

Therefore, SRAMs with improved SNM operation that avoid the disadvantages of the prior art are desirable.

SUMMARY OF THE INVENTION

A static random access memory ("SRAM") has a plurality of SRAM cells connected to a word line. A static noise margin ("SNM") detector controls a pull-down transistor that selectively couples the word line to a ground path. The SNM detector is configured to produce a first output signal in response to a SNM event that couples the word line to the ground path, and otherwise produces a second output signal that de-couples the word line from the ground path.

DETAILED DESCRIPTION

An Exemplary FPGA

Figure 2:
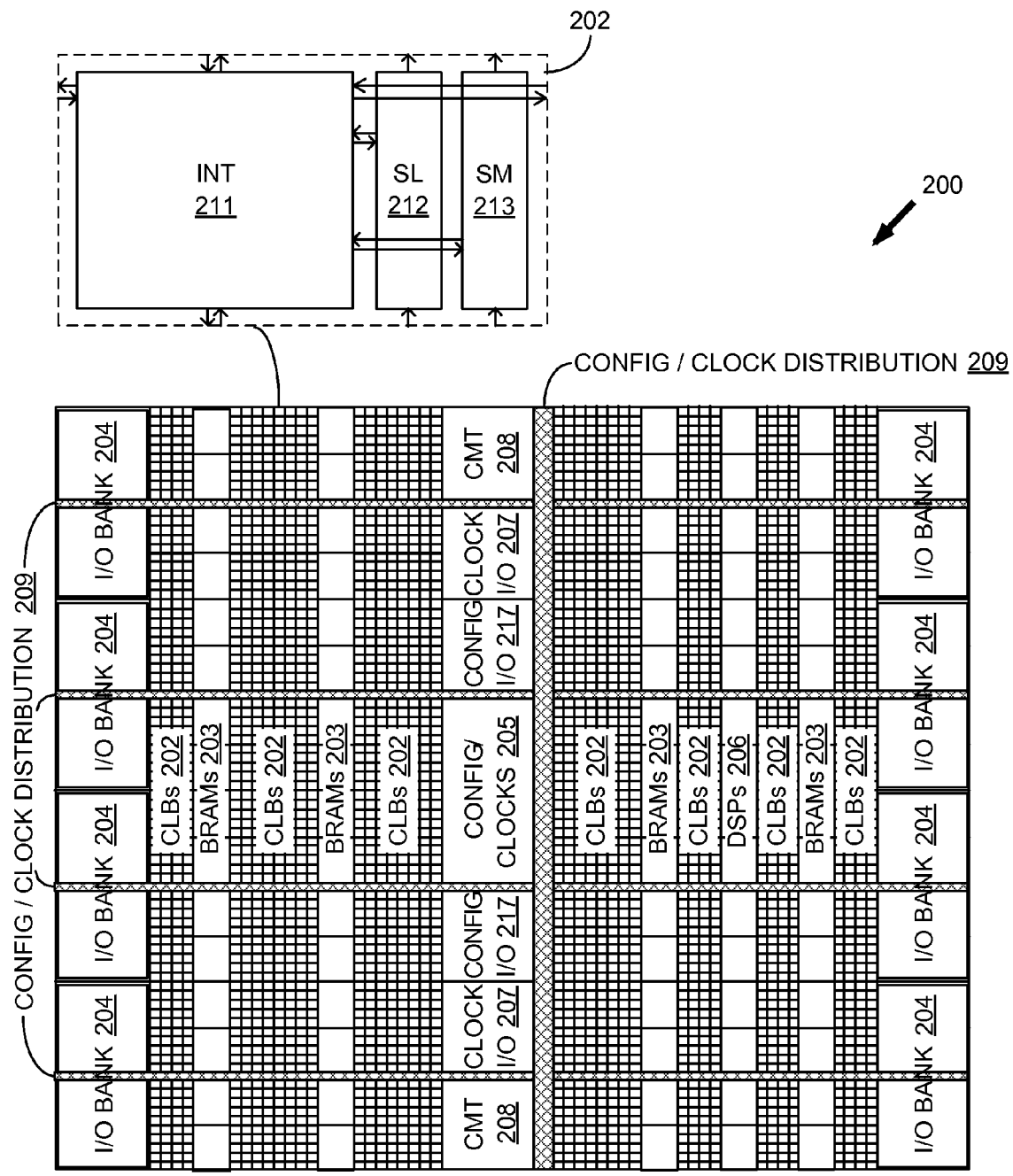
FIG. 2 illustrates an FPGA architecture including an embodiment of the invention.

FIG. 2 illustrates an FPGA architecture 200 implementing one or more embodiments of the invention. The FPGA architecture 200 includes a large number of different programmable tiles including multi-gigabit transceivers (not shown), configurable logic blocks (CLBs 202), random access memory blocks (BRAMs 203), input/output blocks (IOBs) organized into I/O banks 204, configuration and clocking logic (CONFIG/CLOCKS 205), digital signal processing blocks (DSPs 206), specialized input/output blocks (I/O 217 and 207) (e.g., configuration ports and clock ports), and other programmable logic 208 such as digital clock managers, analog-to-digital converters, system monitoring logic, and so forth. Some FPGAs also include dedicated processor blocks (not shown).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the example included at the top of FIG. 2.

For example, a CLB 202 can include two different "slices", slice L (SL 212) and slice M (SM 213) that can be programmed to implement user logic plus a single programmable interconnect element (INT 211). A BRAM 203 can include a BRAM logic element (not shown) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 206 can include a DSP logic element (not shown) in addition to an appropriate number of programmable interconnect elements. An IOB 204 can include, for example, two instances of an input/output logic element (not shown) in addition to one instance of the programmable interconnect element (INT 211). As will be clear to those of skill in the art, the actual I/O pads connected, for example, to the I/O logic element are manufactured using metal layered above the various illustrated logic blocks, and typically are not confined to the area of the input/output logic element.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Embodiments of the invention are incorporated in any of several portions of the FPGA 200. For example, SRAMs using SNM detector techniques are incorporated in BRAMs 203 or configuration memory. Configuration memory is distributed throughout an FPGA and is generally present in numerous types of programmable blocks, such as CLBs and IOs. SRAM is particularly desirable in some types of memory, such as cache memory in CPUs and FPGAs, because of the superior speed performance over other types of memories.

An Exemplary SRAM

Figure 1:
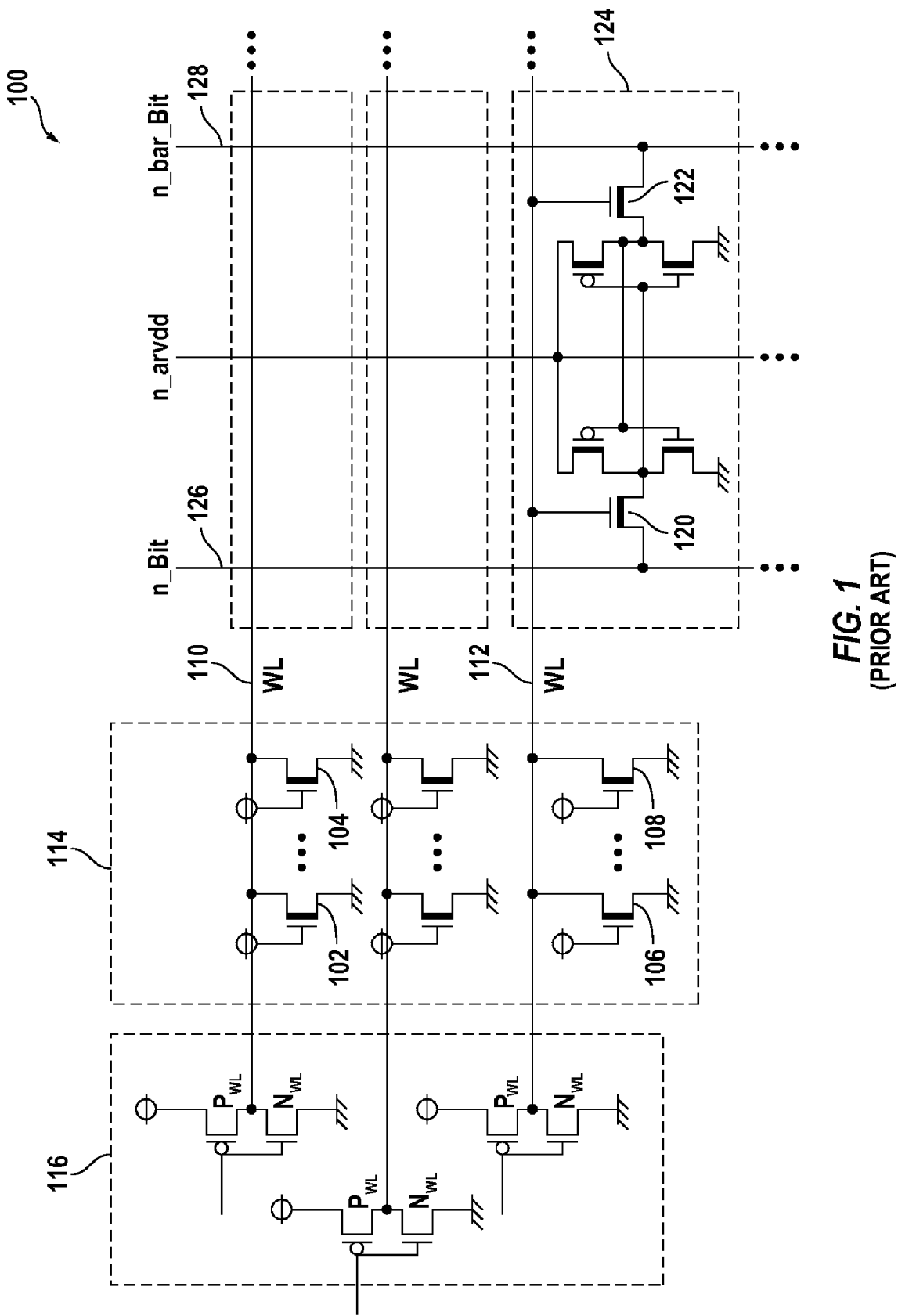
FIG. 1 is a circuit diagram of a portion of a prior art SRAM.
Figure 3:
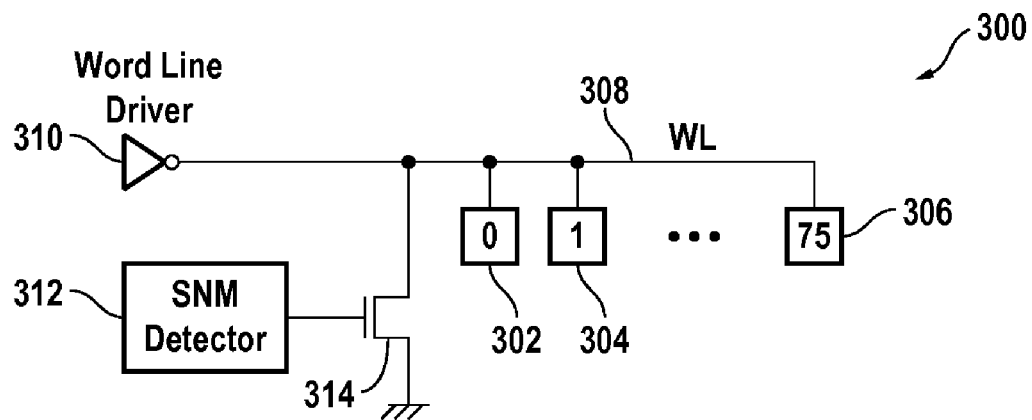
FIG. 3 is a diagram of a portion of an SRAM according to an embodiment.

FIG. 3 is a diagram of a portion of an SRAM 300 according to an embodiment. The SRAM 300 has a number of SRAM memory cells 302, 304, 306 connected to a word line 308. The SRAM has additional word lines and memory cells, as is common in the art. The word line 308 is shown with seventy-six associated memory cells, which is merely exemplary. A word line in an embodiment could have fewer or more associated memory cells. A word line driver 310 selectively activates the word line 308. Individual memory cells are read by activating a bit line (not shown, see FIG. 1, ref. num. 126) of the memory cell. Activating the word line and bit line of a memory cell couples the memory cell to a sensing circuit (not shown) and the data value stored in the memory cell is sensed, as is well known in the art. Memory arrays and their operation are very well known in the art, and a more detailed description of the operation of SRAM 300 is therefore omitted.

SNM is basically the amount of voltage noise required at the internal nodes of a memory cell that will flip the cell's contents (e.g., from a "0" value to a "1" value or vice versa). As the SNM declines, less voltage noise is required to corrupt the data stored in the memory cell.

A SNM detector 312 is connected to the word line 308. Additional SNM detectors (not shown) are connected to additional word lines (also not shown) in the SRAM 300. The SNM detector 312 controls operation of the pull-down FET 314 by turning on or off the pull down FET connected to the wordline. When the pull-down FET 314 turns ON, the word line 308 is resistively connected to ground, which lowers the word line voltage, increasing the effective resistance of the pass gate transistor(s) in the memory cell(s) (see, e.g., FIG. 1, ref. num. 120). A higher resistance of the pass gate provides better isolation of the storage devices (latch portion) of the memory cell.

During a WRITE operation, the worst case occurs when the NMOS transistors in the pass gate of the memory cell are slow and the PMOS transistors in the latch portion are fast. This blocks current flow into the latch through the weak pass gate, making it more difficult for the word line driver to flip the data value of the latch. Increasing the resistance of the pass gate during a WRITE operation makes writing more difficult because a greater WRITE current is needed to overdrive the latch portion. An increased pass gate resistance also decreases the READ current available for sensing, which is less susceptible to SNM errors. If the memory cell is susceptible to SNM errors, it is desirable to increase the pass gate resistance, which is accomplished when the SNM detector 312 detects an SNM event and turns on the pull-down FET 314. The pull-down FET 314 is an NMOS FET, but alternatively is a PMOS FET when used with an alternative SNM detector type.

The pass gate overdrive is unaffected for IC dies that do not have an SNM issue, preserving the best operating performance for the prime devices that are selectively binned from sub-prime devices. In IC dies that have an SNM issue, there is not a static current draw for lowering the word line voltage unless an SNM event occurs. Providing an SNM detector to an SRAM allows smaller memory cells to be used, resulting in an estimated 20% area reduction when implemented in a 45-nm technology.

An Exemplary SNM Detector

Figure 4:
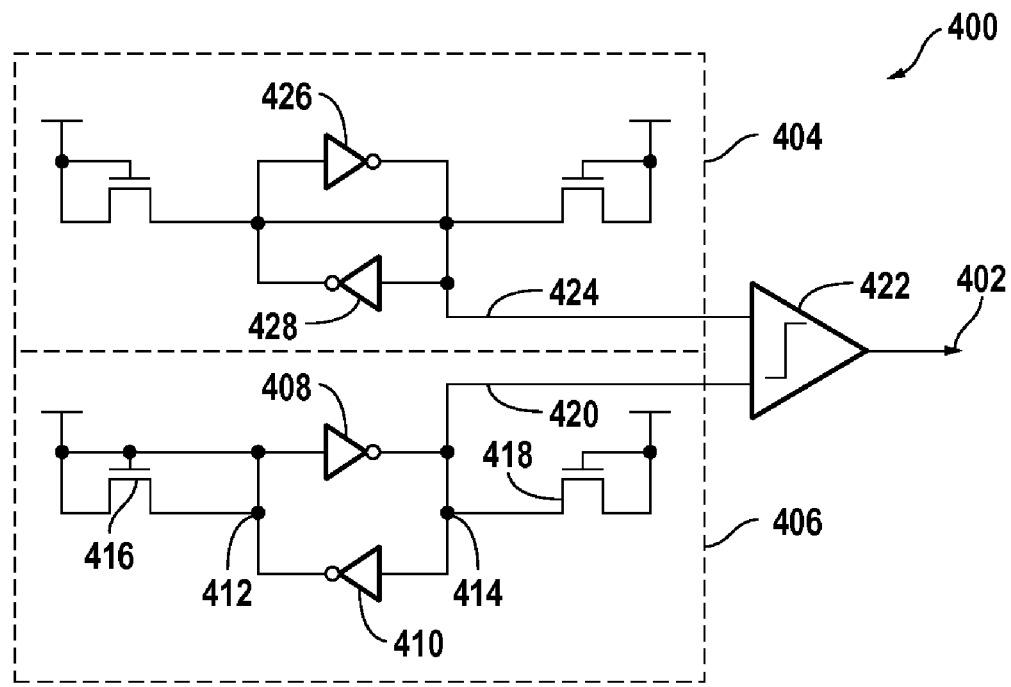
FIG. 4 is a diagram of an SNM detector according to an embodiment.

FIG. 4 is a diagram of an SNM detector 400 according to an embodiment. The SNM detector 400 is suitable for use as the SNM detector 312 shown in FIG. 3, with the output 402 of the SNM detector 400 being used to control (gate) the pull-down FET 314. Static noise susceptibility can arise from permanent conditions in the IC, such as layout pattern offset or process mismatches resulting from implantation or gate oxide thickness, and also from operating conditions, such as supply voltage ripple and thermal noise. Static noise sources can combine to create SNM events that are essentially constant, or SNM events that are temporary (e.g., that arise during a particular thermal condition or power supply condition). Sometimes essentially the entire SRAM experiences a global SNM event, other times, SNM events affect only a few memory cells. An SNM event occurs when a low voltage representing a logic "0" can not be stored in one particular node of the latch.

The SNM detector 400 has a shorted cell 404 and a replica cell 406. The replica cell 406 has head-to-tail inverters 408, 410 forming a latch that replicates the latch portion of memory cells (compare FIG. 1, ref. num. 124) coupled to the associated word line (see FIG. 3, ref. nums. 302, 304, 306). The replica cell has two data nodes 412, 414 that hold opposite data states (i.e., one data node holds a "0" value, and the other holds a "1" value). The replica cell 406 is initialized during power-up of the IC so that one data node holds a selected value, while the other holds the opposite value. For example, the NMOS pass gate 416 is turned ON during power-up while the other NMOS pass gate 418 is held OFF. This places data node 412 in a "1" state ("1-node") and data node 414 in a "0" state ("0-node"). The NMOS pass gates 416, 418 replicate the pass gates in an SRAM memory cell (compare, FIG. 1, ref. nums. 120, 122). The data node 414 is connected to one input 420 of a comparator 422.

The other input 424 of the comparator 422 is connected to the output of the shorted cell 404. The shorted cell 404 has inverters 426, 428 that are designed to be the same as the inverters 408, 410 in the replica cell 406. The inverters 408, 410, 426, 428 are in close physical proximity on the IC die and track factors that contribute to static noise, such as mask offset, implantation variations, runout, gate oxide thickness, and thermal environment. The shorted cell provides a reference voltage (i.e., the critical voltage at which read disturb is triggered).

Since the NMOS and PMOS devices in the inverters 426, 428 in the shorted cell are well-matched, the output 424 of the shorted cell will be about one-half the supply voltage. The voltage of the shorted cell will be referred to as the equalization voltage. Those of skill in the art understand that minor differences in voltage supply line drop, ground line resistance, and other factors result in an equalization voltage that is not exactly one-half the supply voltage, but for purposes of discussion will be referred to as one-half the supply voltage. The equalization voltage tracks the SNM.

The comparator 422 compares the equalization voltage 424 from the shorted cell 404 with the data value (e.g. "0") at node 414 in the replica cell 406. If the equalization voltage becomes equal to or less than the "0" value at node 414, the replica cell, it indicates an SNM event, in other words, that memory cells in the vicinity of the SNM detector (e.g., the memory cells coupled to the associated word line) are susceptible to static noise upset. The comparator output goes HIGH, turning on the pull-down transistor (see, FIG. 3, ref. num. 314) and pulling the associated word line (FIG. 3, ref. num. 308) lower. Pulling the word line voltage lower provides greater resistance in the pass gates of the memory cells (FIG. 3, ref. nums. 302, 304, 306), which increases the SNM for those memory cells.

Modeling Results Showing Improved SNM in SRAM Using an Embodiment

Figure 5:
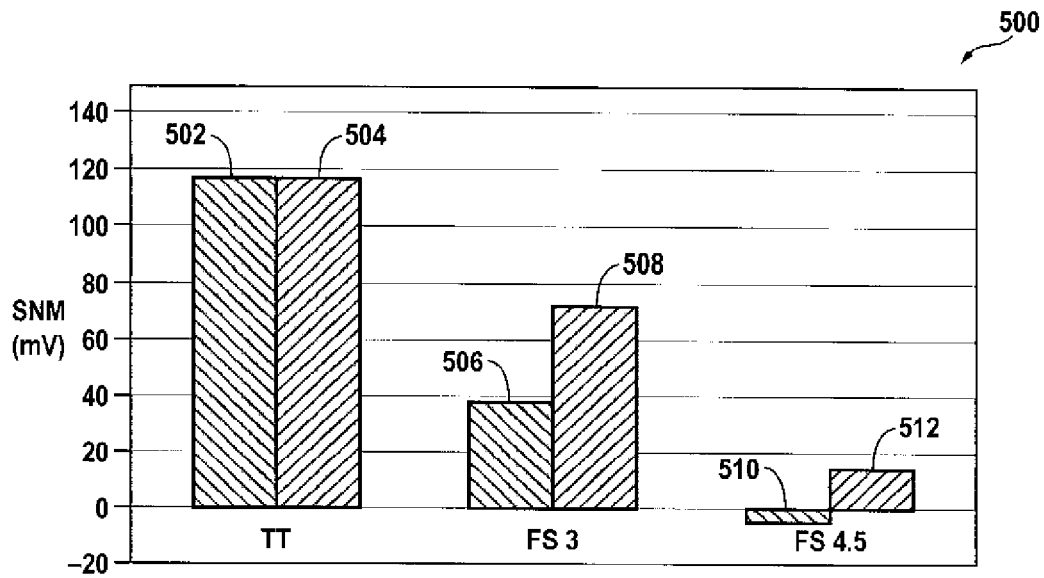
FIG. 5 is a chart illustrating expected SNM improvement for embodiments of SRAMs operating at different process corners.

FIG. 5 is a chart 500 illustrating expected SNM improvement for embodiments of SRAMs operating at different process corners. These results were obtained using a conventional circuit simulator, of which several are well-known in the art of IC design and simulation. The terms FS3 and FS 4.5 relate to the speed difference between NMOS and PMOS devices in a memory cell. A memory cell that is FS4.5 has a higher ratio between the fast NMOS characteristic and the slow PMOS characteristic than a memory cell that is FS3, and is more susceptible to static noise upset (i.e., has a lower SNM).

The first set of bars 502, 504 shows the SNM in millivolts ("mV") for an SRAM cell designed using 45 nm technology. The first bar 502 shows a SNM of about 118 mV for an SRM cell having NMOS and PMOS devices of typical speed (commonly called a "TT" cell) using 45 nm technology at supply voltage of 0.9V. The second bar 504 shows the same TT cell under similar operating conditions with the addition of an SNM detector controlling a pull-down transistor on the word line of the memory cell according to an embodiment, such as described above in reference to FIGS. 3 and 4. The SNM detector also has TT cells for the shorted and replica cells. There is no significant difference between the SNM for the conventional and new SRAMS. In a typical application, TT cells have sufficient SNM for reliable operation, and the SNM detector does not turn on the pull-down transistor, thus SNM should remain the same.

The second set of bars 506, 508 shows the SNM for FS3 memory cells at an operating voltage of 0.9 volts. As discussed above, an FS memory cell is the worst-case condition for reading a memory cell that is susceptible to static noise. As the ratio of fast NMOS:slow PMOS increases, the SNM decreases. For the simulation, the memory cell, and the replica and shorted cells of the SNM detector were all modeled as FS cells in a 45 nm technology with the fast:slow ratio modeled to be a value of three.

It is appropriate to model the memory, replica, and shorted cells in a similar fashion because they are in relatively close physical proximity on the IC chip and typically exhibit similar processing and operating conditions affecting SNM. In a conventional SRAM 506, the SNM is about 39 mV, while in an SRAM according to an embodiment 508, the SNM improves to about 72 mV. Adding an SNM detector to an SRAM of this design greatly improves the SNM when reading FS memory cells.

The third set of bars 510, 512 shows the SNM for FS4.5 memory cells at an operating voltage of 0.9 volts. In a conventional SRAM 510, the SNM for an FS4.5 cell is negative (about −5 mV), indicating that the FS4.5 memory cell in this design is suffering an SNM event. In an SRAM according to an embodiment 512, the SNM improves to about 15 mV.

Flow Chart of an Exemplary Method

Figure 6:
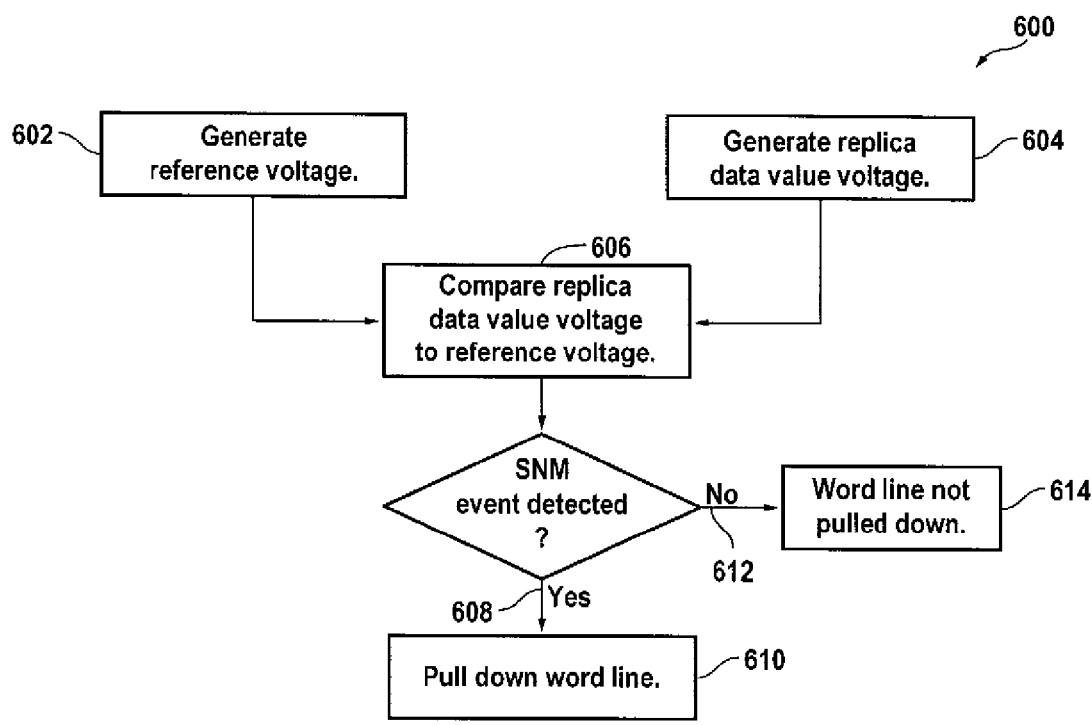
FIG. 6 is a flow chart of a method of operating an SRAM according to an embodiment.

FIG. 6 is a flow chart of a method of operating an SRAM 600 according to an embodiment. An IC having an SRAM includes a SNM detector that has a reference cell and a replica cell. The SNM detector generates a reference voltage from the reference cell (step 602) and concurrently a replica voltage from the replica cell (step 604). The replica cell is typically initialized to a selected data state. In a particular embodiment, the replica cell is essentially a replica of a memory cell in the SRAM and the reference cell is a shorted cell similar to a memory cell in the SRAM. The reference voltage is an equalization voltage that represents the voltage between the supply voltage and ground that is produced when a CMOS latch is shorted, and the replica voltage is logically a "1" or "0" value produced by replica cell. In situations where an SNM event occurs, the replica voltage (i.e., a HIGH or LOW voltage) is a below or above the desired limits for voltages representing these data states (i.e., the "1" or "0" data state).

The reference voltage is compared to the replica voltage (step 606), and, if a HIGH replica voltage is below the reference voltage or a LOW replica voltage is above the reference voltage (branch 608), a word line is pulled down (step 610), for example, by turning the pull-down transistor 314 (FIG. 3) ON, to increase the resistances of the pass gates of memory cells connected to the word line, improving SNM of those memory cells. If an SNM is not detected (branch 610), the word line is not pulled down (step 614), for example, the pull-down transistor 314 (FIG. 3) is kept OFF.

While the present invention has been described in connection with specific embodiments, variations of these embodiments will be obvious to those of ordinary skill in the art. Therefore, the spirit and scope of the appended claims should not be limited to the foregoing description.

The invention claimed is:

1. A static random access memory ("SRAM"), comprising:
a word line;
a plurality of SRAM cells connected to the word line, the word line controlling at least one pass gate in each of the plurality of SRAM cells;
a static noise margin ("SNM") detector configured to produce a first output signal in response to a SNM event and otherwise producing a second output signal; and
a pull-down transistor selectively coupling the word line to a ground path in response to the first output signal and de-coupling the word line from the ground path in response to the second output signal,
wherein the SNM detector has a reference cell, a replica cell, and a comparator, the replica cell producing a replica voltage connected to a first input of the comparator and the reference cell producing an equalization voltage connected to a second input of the comparator.

2. The SRAM of claim 1 wherein the reference cell is a shorted memory cell and the equalization voltage is one-half a supply voltage of the SRAM.

3. The SRAM of claim 2 wherein the replica voltage represents a LOW data value, the comparator producing the first output when the replica voltage exceeds the equalization voltage.

4. The SRAM of claim 2 wherein the replica voltage represents a HIGH data value, the comparator producing the first output when the replica voltage drops below the equalization voltage.

5. The SRAM of claim 1 wherein the reference cell has a first inverter and a second inverter, an output of the first inverter being shorted to an output of the second inverter.

6. The SRAM of claim 1 wherein the replica cell has a latch having a first inverter and a second inverter, an output of the first inverter being connected to an input of the comparator and to an input of the second inverter, and an output of the second inverter being connected to an input of the first inverter.

7. The SRAM of claim 1 wherein the reference cell has a first inverter and a second inverter, an output of the first inverter being shorted to an output of the second inverter, and wherein the replica cell has a latch having a third inverter and a fourth inverter, an output of the third inverter being connected to a second input of the comparator and to an input of the second inverter, and an output of the fourth inverter being connected to an input of the third inverter.

8. A field-programmable gate array ("FPGA") having the SRAM of claim 1.

9. The FPGA of claim 8 wherein the SRAM comprises configuration memory of the FPGA.

10. A method of operating a static random access memory ("SRAM"), comprising:
generating a reference voltage from a reference cell;
concurrently with generating the reference voltage, generating a replica voltage from a replica cell;
comparing the replica voltage to the reference voltage; and
pulling a selected word line down if a static noise event is detected so as to increase resistances of pass gates of memory cells connected to the word line.

11. The method of claim 10 wherein the reference voltage is an equalization voltage and the replica voltage represents a LOW data value, the step of pulling the selected word line down occurring when the LOW data value exceeds the equalization voltage.

12. The method of claim 10 wherein the reference voltage is an equalization voltage and the replica voltage represents a HIGH data value, the step of pulling the selected word line down occurring when the HIGH data value drops below the equalization voltage.

13. The method of claim 10 wherein the reference voltage is an equalization voltage generated by shorting a first output of a first inverter to a second output of a second inverter in the reference cell.

14. The method of claim 10 wherein pulling the selected word line down comprises turning ON a pull-down transistor that couples the selected word line to a ground path.

15. The method of claim 10 further comprising, before generating the replica voltage from the replica cell, initializing the replica cell to a selected data value.

16. An integrated circuit, comprising:
   an interconnect structure; and
   a static random access memory ("SRAM") coupled to the interconnect structure, wherein the SRAM comprises:
     a word line;
     a plurality of SRAM cells connected to the word line, the word line controlling at least one pass gate in each of the plurality of SRAM cells;
     a static noise margin ("SNM") detector configured to produce a first output signal in response to a SNM event and otherwise producing a second output signal; and
     a pull-down transistor selectively coupling the word line to a ground path in response to the first output signal and de-coupling the word line from the ground path in response to the second output signal,
   wherein the SNM detector comprises a reference cell, a replica cell, and a comparator, the replica cell producing a replica voltage coupled to a first input of the comparator and the reference cell producing an equalization voltage coupled to a second input of the comparator.

17. The integrated circuit of claim 16, wherein the integrated circuit comprises a programmable integrated circuit, and the SRAM comprises configuration memory of the programmable integrated circuit.

18. The integrated circuit of claim 16, wherein the integrated circuit comprises a programmable integrated circuit, and the SRAM comprises a random access memory block of the programmable integrated circuit.

19. The integrated circuit of claim 16, wherein the integrated circuit comprises a CPU, and the SRAM comprises cache memory of the CPU.

* * * * *